(12) United States Patent
Venkatraman et al.

(10) Patent No.: US 8,610,611 B2
(45) Date of Patent: Dec. 17, 2013

(54) ANALOG-TO-DIGITAL CONVERTER FOR BIOMEDICAL SIGNALS

(75) Inventors: Subramaniam Venkatraman, Fremont, CA (US); Harinath Garudadri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 13/358,625

(22) Filed: Jan. 26, 2012

(65) Prior Publication Data

US 2012/0194372 A1    Aug. 2, 2012

Related U.S. Application Data

(60) Provisional application No. 61/438,223, filed on Jan. 31, 2011.

(51) Int. Cl.
*H03M 3/00* (2006.01)

(52) U.S. Cl.
USPC ............ 341/143; 341/163; 341/172; 600/300

(58) Field of Classification Search
USPC .......................... 341/143, 161, 162, 163, 172
See application file for complete search history.

(56) References Cited

U.S. PATENT DOCUMENTS

| | | | | |
|---|---|---|---|---|
| 2,605,361 A | * | 7/1952 | Cutler | 375/247 |
| 3,449,741 A | * | 6/1969 | Ererton, Jr. | 341/108 |
| 3,868,567 A | * | 2/1975 | Ekstrom | 600/517 |
| 4,466,440 A | * | 8/1984 | Money et al. | 607/9 |
| 7,994,850 B2 | * | 8/2011 | Burke | 327/554 |
| 8,169,512 B2 | * | 5/2012 | Nakata et al. | 348/245 |
| 2003/0086289 A1 | * | 5/2003 | Horan | 365/150 |
| 2009/0259138 A1 | * | 10/2009 | Lin et al. | 600/545 |

OTHER PUBLICATIONS

Ramkunar et al., DPCM-Differential Pulse Code Modulation, Internet document http://www.birds-eye.net/definition/acronym/?id=1361924644 ; downloaded Sep. 4, 2013, publication date unknown.*
Rao, Principles of Communication Chapter 6 Digital Transmission of Analog Signals: PCM, DPCM and DM; pp. 1-99 esp. p. 71; Internet URL http://nptel.iitm.ac.in/courses/IIT-MADRAS/Principles_of_Communication1/Pdfs/1_9.pdf, downloaded Sep. 4, 2013, PDF document properties dates: created Mar. 6, 2007, modified Jan. 30, 2009.*
International Search Report and Written Opinion—PCT/US2012/023397—ISA/EPO—Jun. 4, 2012.

* cited by examiner

*Primary Examiner* — Howard Williams
(74) *Attorney, Agent, or Firm* — Paul S. Holdaway

(57) ABSTRACT

Certain aspects of the present disclosure relate to a technique for producing a difference value by offsetting a current value of an analog signal with a stored previous value of the analog signal, and generating a digital representation of the difference value. Digital representations obtained by this technique may be sent over a channel to a receiver device for reconstruction of the original analog signal. An integrator of the receiver device may be configured to process (sum) the received samples to generate a reconstructed version of the original signal.

23 Claims, 12 Drawing Sheets

ANALOG-TO-DIGITAL CONVERTER FOR BIOMEDICAL SIGNALS

CLAIM OF PRIORITY UNDER 35 U.S.C. §119

The present Application for Patent claims benefit of U.S. Provisional Patent Application Ser. No. 61/438,223, entitled, "Analog-to-digital converter for biomedical signals", filed Jan. 31, 2011 and assigned to the assignee hereof and hereby expressly incorporated by reference herein.

BACKGROUND

1. Field

Certain aspects of the present disclosure generally relate to signal processing and, more particularly, to designing an analog-to-digital converter (ADC) for digitizing and communicating biomedical signals.

2. Background

Biomedical signals, such as electrocardiograms (ECG) and electroencephalograms (EEG), are typically sampled at hundreds of Hz. There is a growing interest in designing low power systems to record and wirelessly transmit such signals from a subject to a gateway or a receiver. This may require the design of low power electronics for analog front-ends.

Successive approximation register (SAR) based Analog-to-Digital Converters (ADCs) are popular in biomedical data acquisition systems due to their medium to high resolution and low power consumption. Lowering power consumption of such systems is desirable since these tend to be battery powered and need to last long periods without recharging. Charge redistribution SAR ADCs are commonly used for this application. One approach to further lowering power consumption can be to develop new ADC architectures based on characteristics of the biomedical signal.

Conventional n-bit SAR ADCs may require n cycles to complete the signal digitization. Using a binary search algorithm, the ADC may convert the input signal one bit at a time from a Most Significant Bit (MSB) to a Least Significant Bit (LSB). However, higher bits of a slowly varying signal may tend to change very infrequently; therefore a large fraction of the conversion cycles may be wasted. One way to address this issue can be to utilize the conventional SAR with modified digital logic, which may start the conversion process from a new point for each sample based on the previous value of the signal, and may choose the depth of the search tree based on the current rate of change of the signal. While this architecture may lead to power reductions, it may cause an increase in area and may not reduce the effect of DC offsets.

SUMMARY

Certain aspects of the present disclosure provide a signal processing apparatus. The apparatus generally includes difference circuitry configured to produce a difference value by offsetting a current value of an analog signal with a stored previous value of the analog signal, and conversion circuitry configured to generate a digital representation of the difference value.

Certain aspects of the present disclosure provide a method for signal processing. The method generally includes producing a difference value by offsetting a current value of an analog signal with a stored previous value of the analog signal, and generating a digital representation of the difference value Certain aspects of the present disclosure provide a signal processing apparatus. The apparatus generally includes means for producing a difference value by offsetting a current value of an analog signal with a stored previous value of the analog signal, and means for generating a digital representation of the difference value.

Certain aspects of the present disclosure provide a signal processing apparatus. The apparatus generally includes a receiver configured to receive a plurality of samples, wherein each of the samples represents a digital version of a difference between two values of a signal captured in an analog domain at two successive time instances of a plurality of time instances associated with the signal, and a first circuit configured to process the plurality of samples to generate a reconstructed version of the signal.

Certain aspects of the present disclosure provide a method for signal processing. The method generally includes receiving a plurality of samples, wherein each of the samples represents a digital version of a difference between two values of a signal captured in an analog domain at two successive time instances of a plurality of time instances associated with the signal, and processing the plurality of samples to generate a reconstructed version of the signal.

Certain aspects of the present disclosure provide a signal processing apparatus. The apparatus generally includes means for receiving a plurality of samples, wherein each of the samples represents a digital version of a difference between two values of a signal captured in an analog domain at two successive time instances of a plurality of time instances associated with the signal, and means for processing the plurality of samples to generate a reconstructed version of the signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
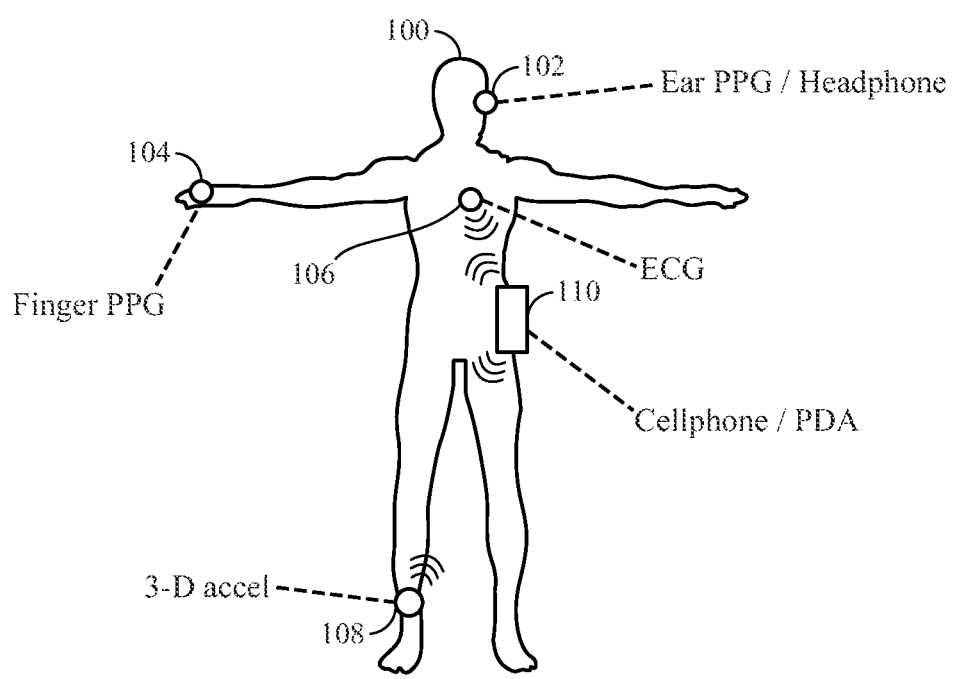
FIG. 1 illustrates an example of a body area network (BAN) in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various wireless communication systems, including communication systems that are based on an orthogonal multiplexing scheme and a single carrier transmission. Examples of such communication systems include Orthogonal Frequency Division Multiple Access (OFDMA) systems, Single-Carrier Frequency Division Multiple Access (SC-FDMA) systems, Code Division Multiple Access (CDMA), and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are created in the frequency domain with OFDM and in the time domain with SC-FDMA. A CDMA system may utilize spread-spectrum technology and a coding scheme where each transmitter (i.e., user) is assigned a code in order to allow multiple users to be multiplexed over the same physical channel.

The teachings herein may be incorporated into (e.g., implemented within or performed by) a variety of wired or wireless apparatuses (e.g., nodes). In some aspects, a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

Certain aspects of the present disclosure may support methods implemented in body area networks (BANs). BANs are a promising concept for healthcare applications such as continuous monitoring for diagnostic purposes, effects of medicines on chronic ailments, and the like. FIG. 1 illustrates an example of a BAN 100 that may comprise several acquisition circuits 102, 104, 106, 108. Each acquisition circuit may comprise a wireless sensor that senses one or more vital biophysical signals and communicates them (e.g., over a wireless channel) to an aggregator (a receiver) 110 for processing purposes.

The BAN 100 may be therefore viewed as a wireless communication system where various wireless nodes (i.e., acquisition circuits and aggregator) communicate using an orthogonal multiplexing scheme, a single carrier transmission, or other suitable wireless communication technique. The aggregator 110 may be a mobile handset, a wireless watch, a headset, a monitoring device, a Personal Data Assistant (PDA), or other device configured for wireless communication. As illustrated in FIG. 1, an acquisition circuit 102 may correspond to an ear photoplethysmograph (PPG) sensor, an acquisition circuit 104 may correspond to a finger PPG sensor, an acquisition circuit 106 may correspond to an electrocardiogram (ECG) sensor (or an electroencephalogram (EEG) sensor), and an acquisition circuit 108 may correspond to a 3D-Accelerometer (3D-Accl) sensor. In an aspect, the acquisition circuits in FIG. 1 may operate in accordance with compressed sensing (CS), where an acquisition rate may be smaller than the Nyquist rate of a signal being acquired. For example, the acquisition circuits illustrated in FIG. 1 may use the CS when sensing body signals.

Figure 2:
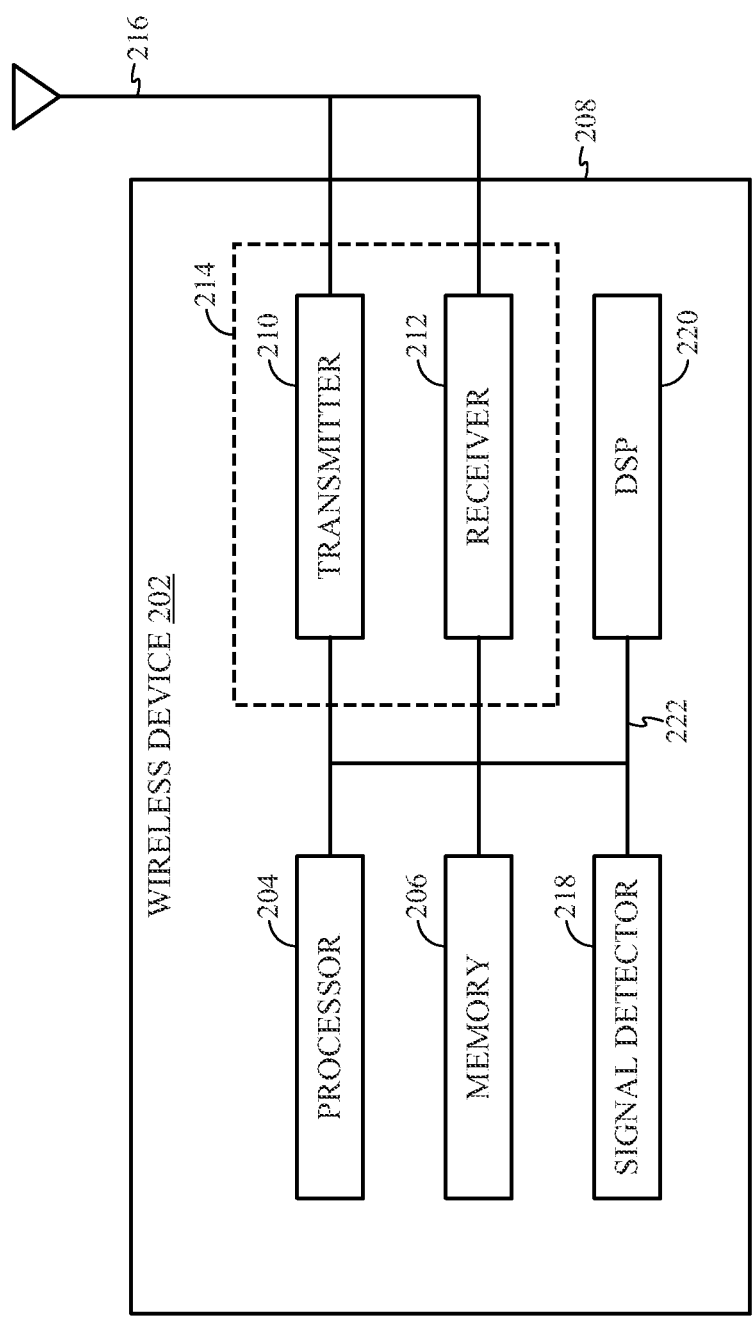
FIG. 2 illustrates various components that may be utilized in a wireless device of the BAN in accordance with certain aspects of the present disclosure.

FIG. 2 illustrates various components that may be utilized in a wireless device 202 that may be employed within the BAN 100. The wireless device 202 is an example of a device that may be configured to implement the various methods described herein. The wireless device 202 may correspond to the aggregator 110 or to one of the acquisition circuits 102, 104, 106, 108.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and another wireless node (e.g., another wireless node in a remote location). The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may detect and quantify the level of signals received by the transceiver 214. The signal detector 218 may quantify detection of such signals using total energy, energy per subcarrier per symbol, power spectral density and/or other quantification metrics. The wireless device 202 may also include a digital signal processor (DSP) 220 for use in processing signals.

The various components of the wireless device 202 may be coupled by a bus system 222, which may include a power bus, a control signal bus, and a status signal bus in addition to a data bus.

Biomedical signals like ECG and EEG may be typically sampled at hundreds of Hz. There is a growing interest in designing low power systems to record and wirelessly transmit such signals from a subject to a gateway, aggregator or other wireless node. This involves designing low-power electronics for the analog front-ends. The present disclosure describes an analog-to-digital converter (ADC) having significantly reduced power consumption and footprint with respect to known ADCs. In one aspect, the ADC may utilize a successive approximation register (SAR) after removing DC bias from a signal being digitized.

Certain aspects of the present disclosure include charge redistribution ADC which may exploit the slowly varying characteristics of biomedical signals. This aspect may achieve more than 50% reduction in area along with significant reductions in power consumption for the ADC and wireless transmission compared to known ADCs.

According to one aspect, a difference between a current value and a previous value of an input signal (e.g., a biomedical signal) may be digitized instead of digitizing the input signal itself. Since biomedical signals may be slowly varying with most energy at lower frequencies, this approach may reduce the dynamic range of the input to the ADC by approximately 2-3 bits. Further reduction in dynamic range may be observed if the input signal comprises a DC offset, which may be automatically removed by this differentiation procedure. The digitized signal may be transmitted wirelessly and reconstructed at a receiving device using a digital integrator.

Characteristics of Biomedical Signals

Figure 3:
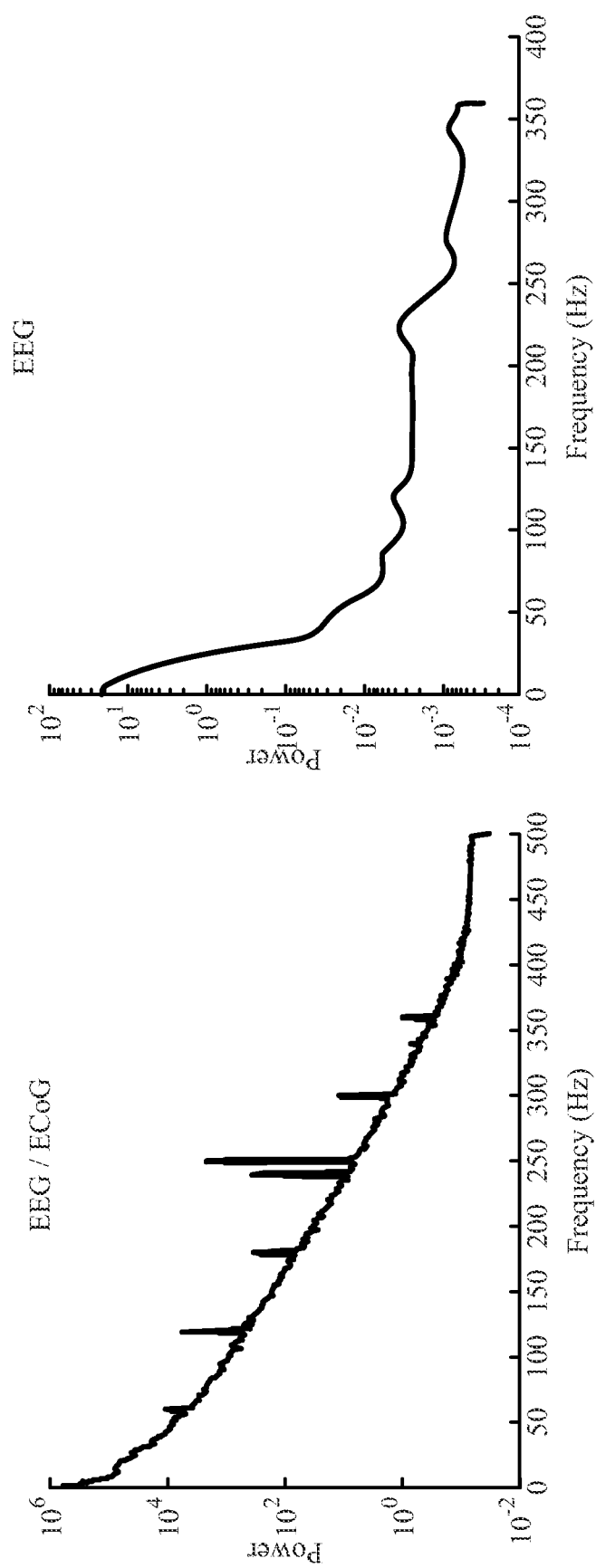
FIG. 3 illustrates examples of power spectral density of biomedical signals in accordance with certain aspects of the present disclosure.

The power spectrum of biomedical signals, such as an electroencephalogram (EEG) signal, an electrocorticogram (ECoG) signal and an electrocardiogram (ECG) signal, shows that most of the power of these signals is located at low frequencies, leaving very low power at high frequencies, as illustrated in FIG. 3. The low amplitude high frequency components may be of interest from a clinical standpoint. These biomedical signals are typically sampled at many hundreds of Hz to a few kHz. Signals with most power at low frequencies may vary slowly, thereby limiting the difference between consecutive samples. Moreover, amplified biomedical signals often comprise a DC offset, which may increase the number of bits used by an ADC in digitizing such amplified biomedical signals.

Figure 4:
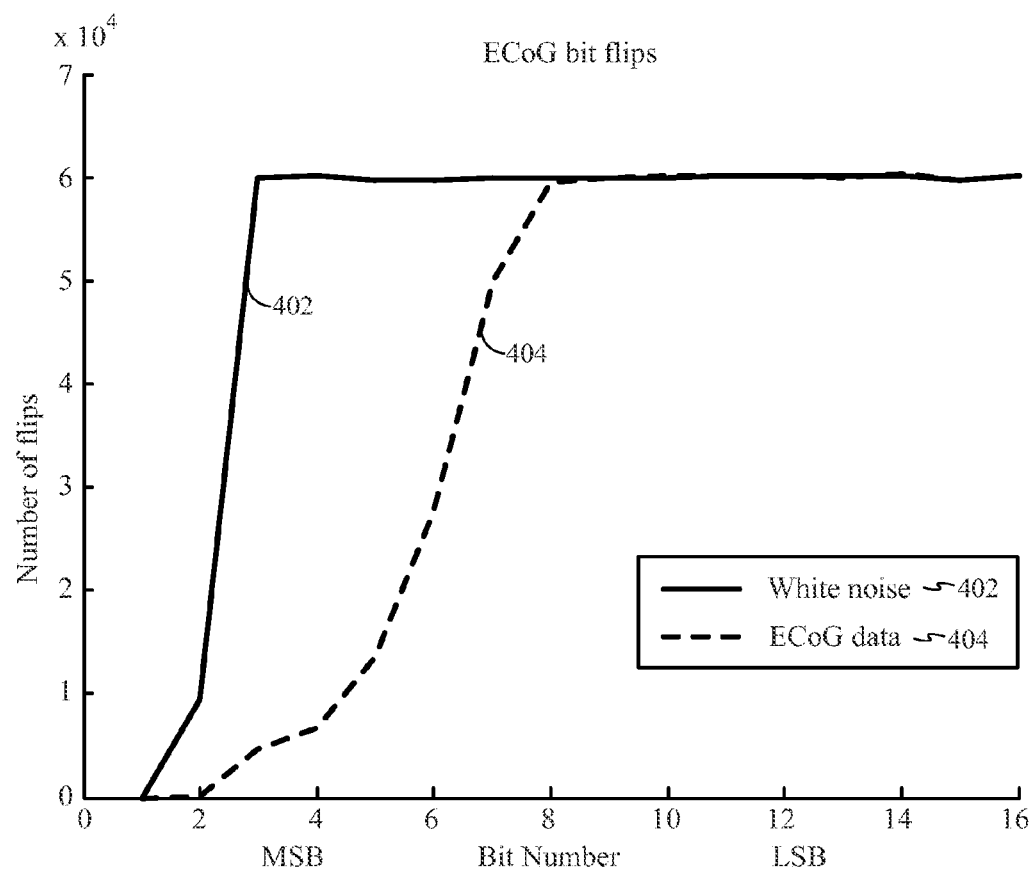
FIG. 4 illustrates an example of bit flips between consecutive samples of a biomedical signal in accordance with certain aspects of the present disclosure.

Conventional n-bit SAR ADCs may require n cycles to digitize a signal. Using a binary search algorithm, the conventional ADC may convert the input signal one bit at a time from a Most Significant Bit (MSB) to a Least Significant Bit (LSB). However, more significant bits of a slowly varying signal may change very infrequently, as illustrated in FIG. 4, which is a chart comparing a white noise signal 402 and ECoG data 404. Therefore, a large fraction of the conversion cycles of conventional ADCs may be wasted. In an aspect, a conventional SAR with modified digital logic may be employed, which may start the conversion process from a new point for each sample based on the previous value of the signal and may choose the depth of the search tree based on the current rate of change of the signal. While this architecture may lead to power reductions, it may cause an increase in area and may not reduce the effect of DC offsets.

Figure 5:
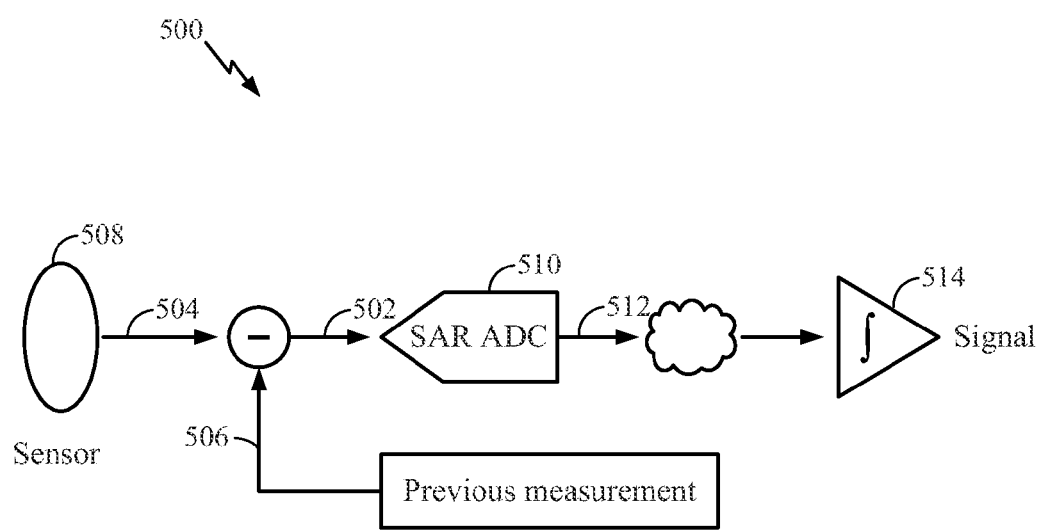
FIG. 5 illustrates an example architecture for digitizing an input signal and integrating received samples to recover the input signal in accordance with certain aspects of the present disclosure.

Novel Architecture for Analog-To-Digital Conversion of Slowly Varying Signals According to one aspect, as illustrated by an example system 500 in FIG. 5, a difference 502 between a current value 504 and a previous value 506 of an input signal (e.g., a slowly varying biomedical signal acquired by a sensor 508) may be digitized instead of digitizing the input signal itself. Since the input signal may be slowly varying, the dynamic range of the input 502 to an ADC 510 may be reduced by 2-3 bits. The achieved reduction may depend on the sampling rate of the input signal and may vary, for example, from 2.9 bits for an ECG signal sampled at 720 Hz to 2.2 bits for an ECG signal sampled at 360 Hz. Further reductions in dynamic range may be realized if the input signal comprises a DC offset, which may be automatically removed by this differentiation procedure. The digitized signal 512 may be then transmitted wirelessly and reconstructed at the receiving end using a digital integrator 514, as illustrated in FIG. 5.

Figure 6:
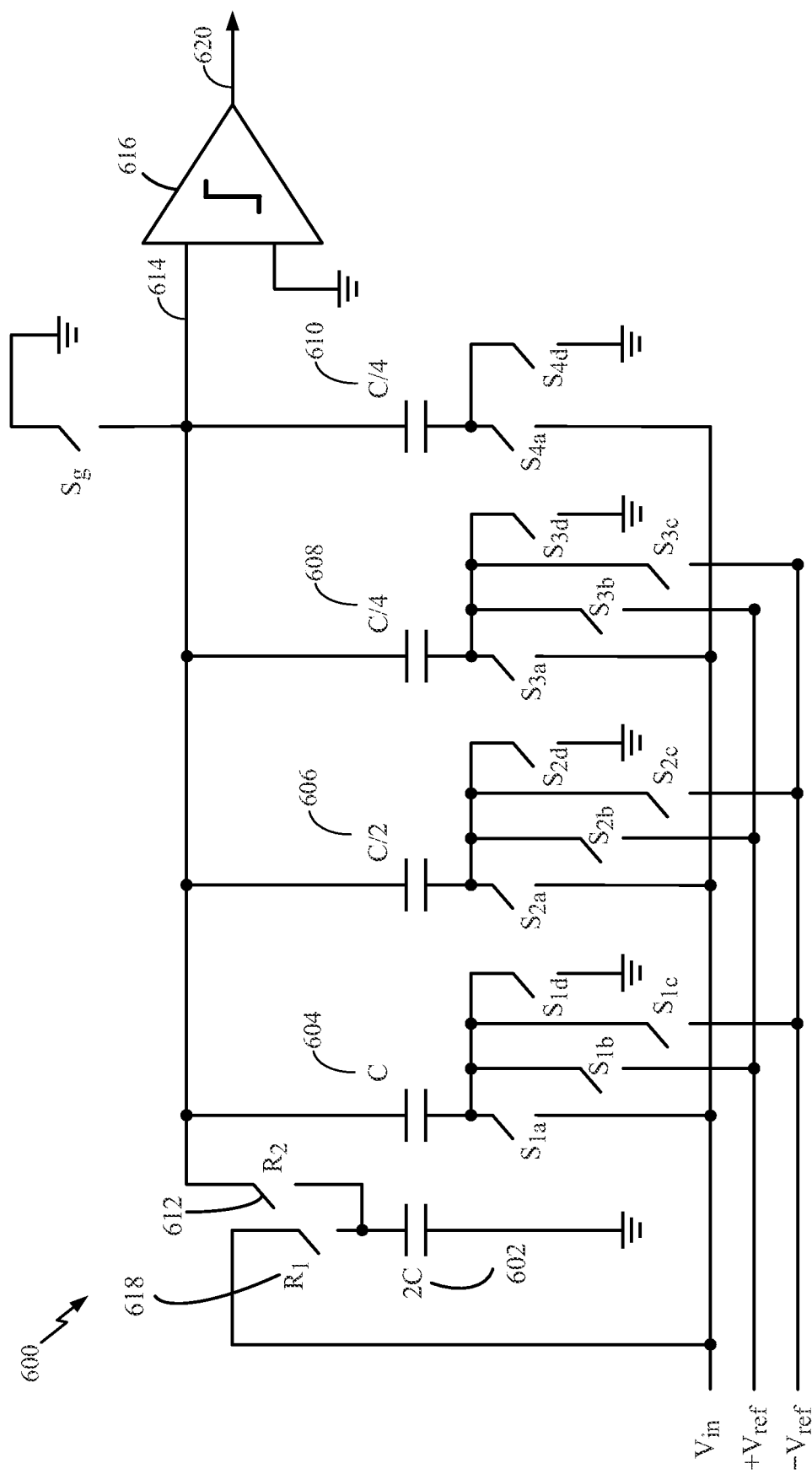
FIG. 6 illustrates an example of a modified successive approximation register (SAR) analog-to-digital converter (ADC) architecture in accordance with certain aspects of the present disclosure.

The differentiation described above may be implemented by a SAR ADC modified to subtract a current value of an input signal from a previous value of the input signal in the analog domain. An example implementation 600 of a three-bit SAR ADC incorporating the differentiation is illustrated in FIG. 6. The differentiation may be achieved by a capacitor 602 of FIG. 6, which may be configured to hold the previously captured analog value of the input signal. After the current value has been sampled by capacitors 604, 606, 608 and 610, a switch 612 may be closed causing charge redistribution between the capacitor 602 and the other capacitors 604-610 of the ADC. The resulting voltage at an input 614 of a comparator 616 may be now $Vin(t_0) - Vin(t_0 - 1)$. The digitization of this difference may now proceed as in the conventional SAR ADC with the exception that the signal may now have a zero mean (i.e., a DC offset may be removed by the differentiation).

An example switching sequence associated with the modified SAR ADC 600 may be as follows. At a first moment in time, $t_0-1$, a switch 618 is closed and the voltage Vin($t_0-1$) of the input signal may be captured on the capacitor 602. After this, the switch 618 may be open. At another moment of time, $t_0$, switches $S_{1a}$, $S_{2a}$, $S_{3a}$, $S_{4a}$, and $S_g$ of the ADC 600 illustrated in FIG. 6 are closed, and the voltage Vin($t_0$) may be captured on the capacitors 604, 606, 608 and 610. After that, the switches $S_{1a}$, $S_{2a}$, $S_{3a}$, $S_{4a}$, and $S_g$ are open, while other switches $S_{1d}$, $S_{2d}$, $S_{3d}$, and $S_{4d}$ of the ADC 600 are closed. The voltage at the input 614 of the comparator 616 may be now −Vin($t_0$). Following this, the switch 612 is closed and then opened, resulting into the voltage at the comparator input 614 to be Vin($t_0-1$)−Vin($t_0$). Next, the switch 618 is closed and then opened in order to capture the voltage Vin($t_0$) at the capacitor 602 for the next cycle. If the voltage at the comparator input 614 is positive, then switch $S_{1b}$ is closed and the voltage at the comparator input 614 becomes (Vin($t_0-1$)−Vin($t_0$))+$V_{ref}/2$. Otherwise, switch $S_{1c}$ is closed and the voltage at the comparator input 614 becomes (Vin($t_0-1$)−Vin($t_0$))−$V_{ref}/2$.

In the example implementation 600, if the dynamic range of the input signal is reduced by more than two bits, this may remove the MSB and MSB-1 bits (i.e., capacitors 4C and 2C respectively, which are not illustrated in FIG. 6, but would be present in implementation 600 if implementation 600 had a dynamic range of two more bits) of the ADC while introducing an extra 2C capacitor for the subtraction. This approach may reduce area and power consumption of the ADC architecture by approximately 50% compared to an ADC that does not perform the differentiation described above. In another case where an input signal comprises a significant DC offset, even greater power and area savings may be attained compared to an ADC suitable for digitizing the signal with significant DC offset that does not perform the differentiation described above.

It should be noted that if the differentiated signal is greater than the MSB of the ADC 600, this may limit a maximum rate of change of a digitized output 620. This can be similar to introducing a 'slew rate' limited amplifier, which is commonly used for biomedical signals.

Figure 7:
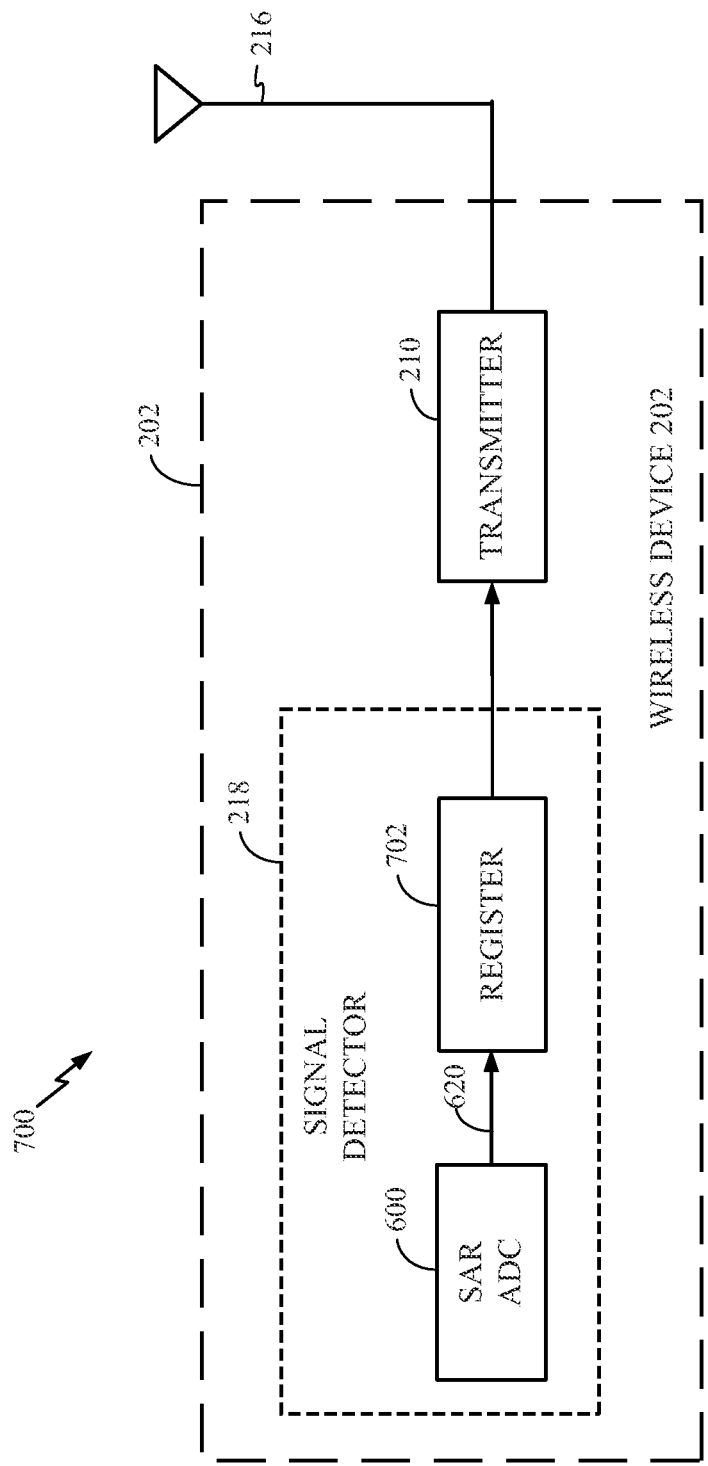
FIG. 7 illustrates an example block diagram showing the modified SAR ADC from FIG. 6 as a part of the wireless device from FIG. 2 in accordance with certain aspects of the present disclosure.

FIG. 7 illustrates an example block diagram 700 showing the modified SAR ADC 600 from FIG. 6 as a part of the wireless device 202 from FIG. 2 in accordance with certain aspects of the present disclosure. As illustrated in FIG. 7, the modified SAR ADC 600 may be, for example, implemented as a part of the signal detector 218 of the wireless device 202. The value of digitized output signal 620 may be stored in a register 702 interfaced with the transmitter 210 of the wireless device 202. The stored digital value may be transmitted over a channel to a receiver device (e.g., over a wireless channel via the antenna 216).

Figure 8:
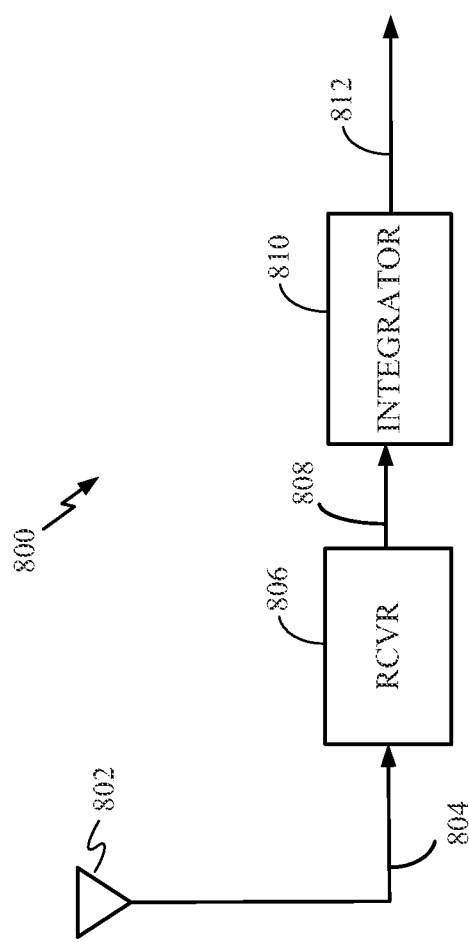
FIG. 8 illustrates an example receiver device in accordance with certain aspects of the present disclosure.

FIG. 8 illustrates an example receiver device 800 (e.g., the aggregator 110 of the BAN 100 from FIG. 1) in accordance with certain aspects of the present disclosure. The receiver device 800 may receive (e.g., over a wireless channel via an antenna 802) a plurality of samples 804, wherein each of the samples may represent a difference between two values of a signal captured in an analog domain at two successive time instances. For example, the differentiation was performed at a transmitter device comprising the modified SAR ADC 600 from FIG. 6, as being illustrated in FIG. 7. The received plurality of samples 804 may be processed by a receiver unit (RCVR) 806. In an aspect, the RCVR 806 may perform frequency down-conversion, filtering, amplifying, and digitizing of the received samples 804 to generate baseband samples 808. An integrator 810 may be configured to process the plurality of baseband samples 808 to generate a reconstructed version 812 of the original signal based on the difference being related to the two values of the successive time instances. In an aspect, the integrator 810 of the receiver device 800 may operate using a different clock than the clock used by the SAR ADC in the transmitter device. In an aspect, the receiver 212 of the wireless device 202 from FIG. 2 may comprise the RCVR unit 806, and the signal detector 218 of the wireless device 202 may comprise the integrator 810.

Figure 9A:
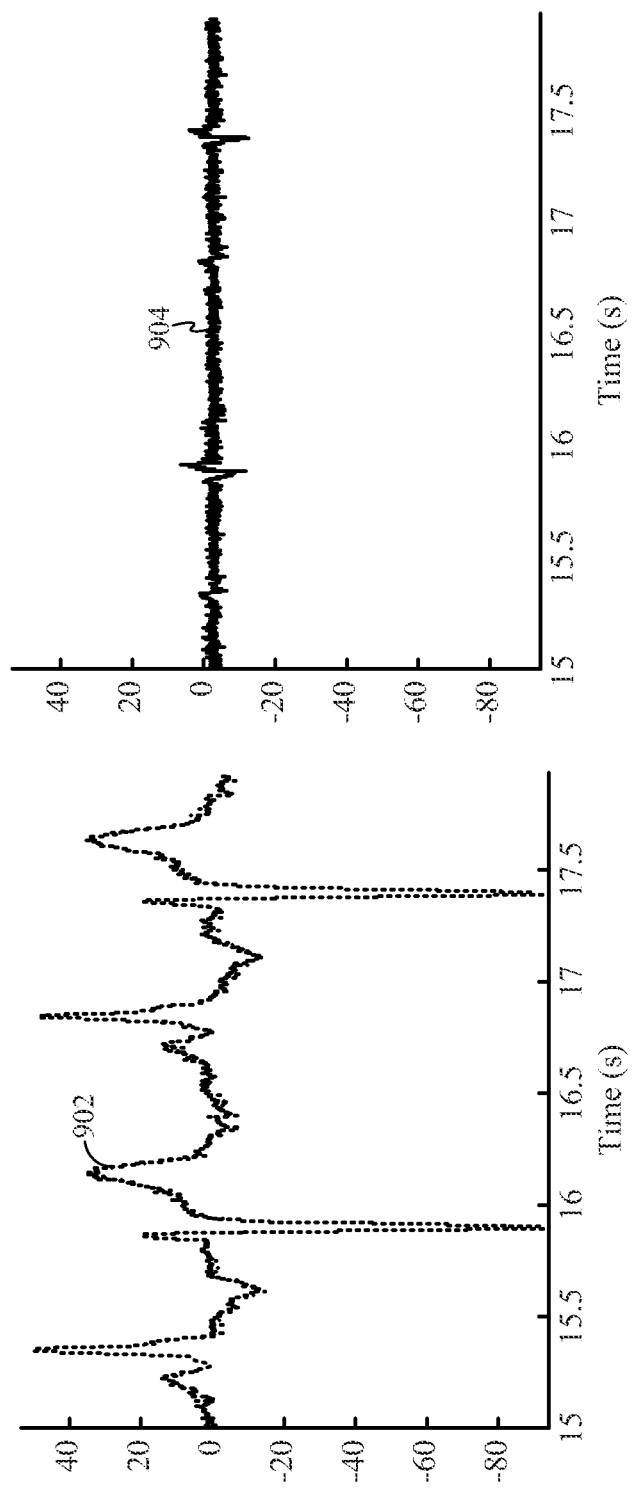
FIGS. 9A-9B illustrate examples of simulation results for a modified SAR ADC in accordance with certain aspects of the present disclosure.
Figure 9B:
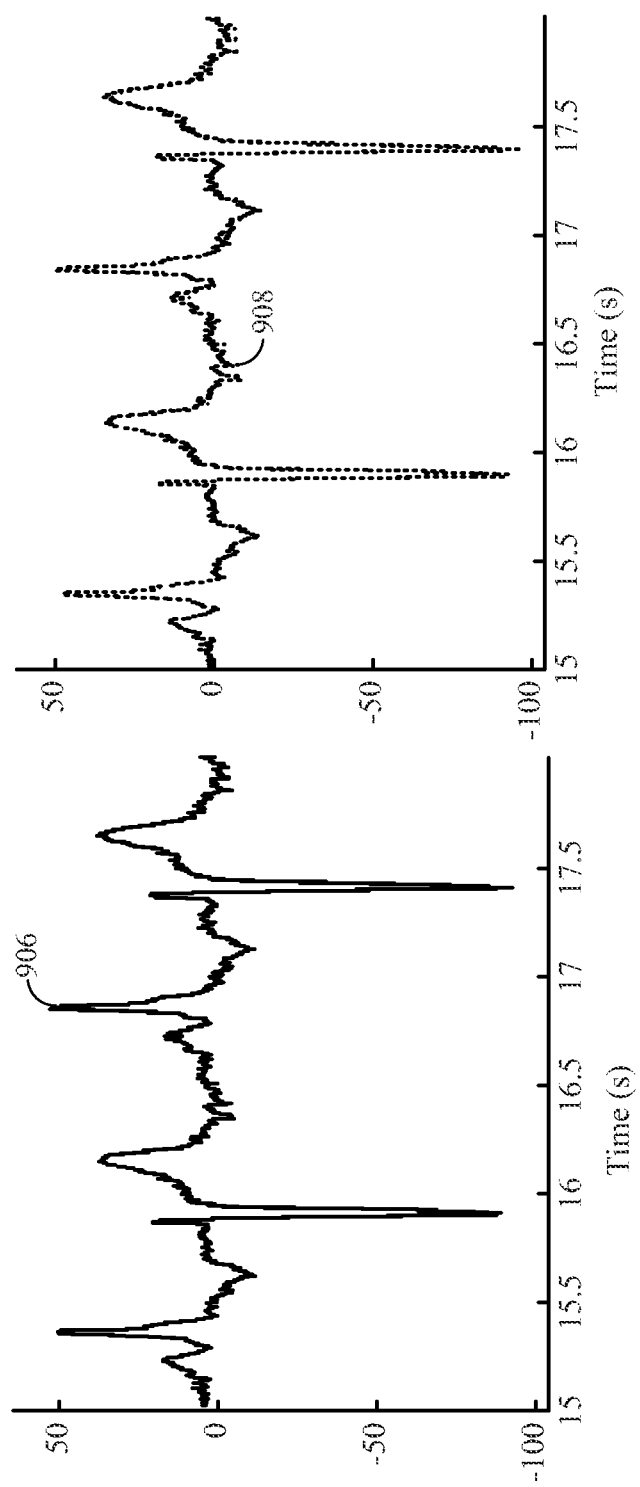

FIG. 9A illustrates an ECG signal 902 which is differentiated using the method described above to obtain a difference signal 904. The signal 904 may be digitized and then integrated to recreate the original signal with high efficiency (see a recreated signal 906 illustrated in FIG. 9B being very close to the original ECG signal 908). It should be noted that the addition of noise equal to +/−0.5 LSB to the digitized signal may not significantly affect the reconstruction. Since the differentiated signal may be transmitted wirelessly and reconstructed at a receiving device (e.g., at the aggregator 110 of the BAN 100 illustrated in FIG. 1), the proposed approach may also serve to reduce the power consumption of the wireless transmission stage. This is because fewer bits are modulated and transmitted when the difference signal 904 is digitized compared to the case when the original ECG signal 902 is directly digitized.

Figure 10:
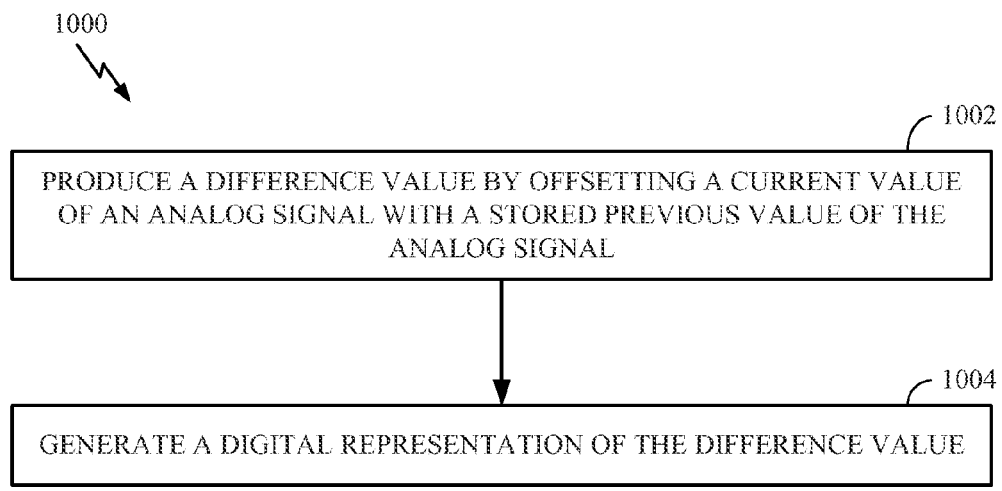
FIG. 10 illustrates example operations that may be performed at a sensor device comprising a modified SAR ADC in accordance with certain aspects of the present disclosure.

FIG. 10 illustrates example operations 1000 that may be performed at a sensor device (e.g., at the acquisition circuits 102, 104, 106, 108 of the BAN 100 from FIG. 1) comprising a modified SAR (e.g., the modified SAR 600 from FIG. 6) in accordance with certain aspects of the present disclosure. At 1002, a difference value may be produced by offsetting a current value of an analog signal with a stored previous value of the analog signal (e.g., stored at the capacitor 602 from FIG. 6). In an aspect, the current value may be captured by storing a voltage proportional to the current value in one or more capacitors (e.g., in the capacitors 604-610 from FIG. 6). At 1004, a digital representation of the difference value may be generated. In an aspect, the stored previous value may be replaced (e.g., at the capacitor 602 from FIG. 6) with the current value after the difference value was produced. In an aspect of the present disclosure, the digital representation of the difference value may be transmitted over a channel (e.g., a wireless channel) to a receiver device (e.g., to the aggregator 110 from FIG. 1 and/or to the receiver device 800 from FIG. 8) where the signal may be then reconstructed (e.g., using an integrator).

Figure 10A:
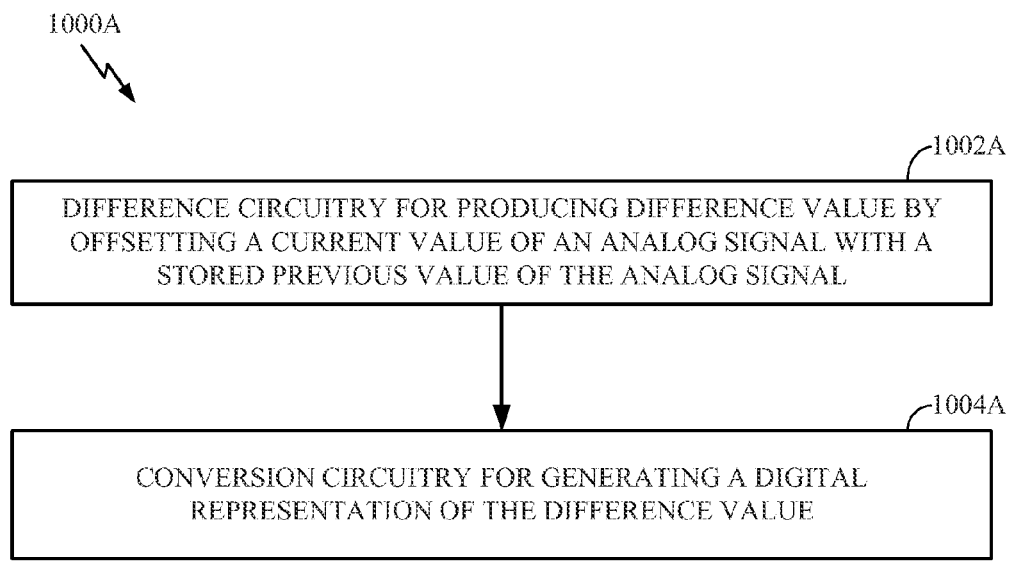
FIG. 10A illustrates example operations that may be performed at a sensor device comprising a modified SAR ADC using example components in accordance with certain aspects of the present disclosure.

FIG. 10A illustrates example operations 1000A that may be performed at a sensor device (e.g., at the acquisition circuits 102, 104, 106, 108 from FIG. 1) comprising a modified SAR ADC (e.g., the modified SAR ADC 600 from FIG. 6) using example components in accordance with certain aspects of the present disclosure. At 1002A, difference circuitry of the sensor device (e.g., the capacitors 602-610, the switches 612 and 618, and other switches of the implementation 600 from FIG. 6) may be configured to produce a difference value by offsetting a current value of an analog signal with a stored previous value of the analog signal. At 1004A, conversion circuitry of the sensor device (e.g., the comparator 616 and the reference voltages of the SAR ADC 600 from FIG. 6) may be configured to generate a digital representation of the difference value.

In an aspect, the digital representation may comprise a plurality of bits. The conversion circuitry may be configured to determine each bit of the digital representation during a different conversion cycle. The bits of the digital representation may be determined in order from an MSB of the digital representation to an LSB of the digital representation. Furthermore, the conversion circuitry may be configured to successively compare the difference value to different reference voltages of the conversion circuitry, and to determine a different bit of the digital representation as a result of each comparison.

Figure 11:
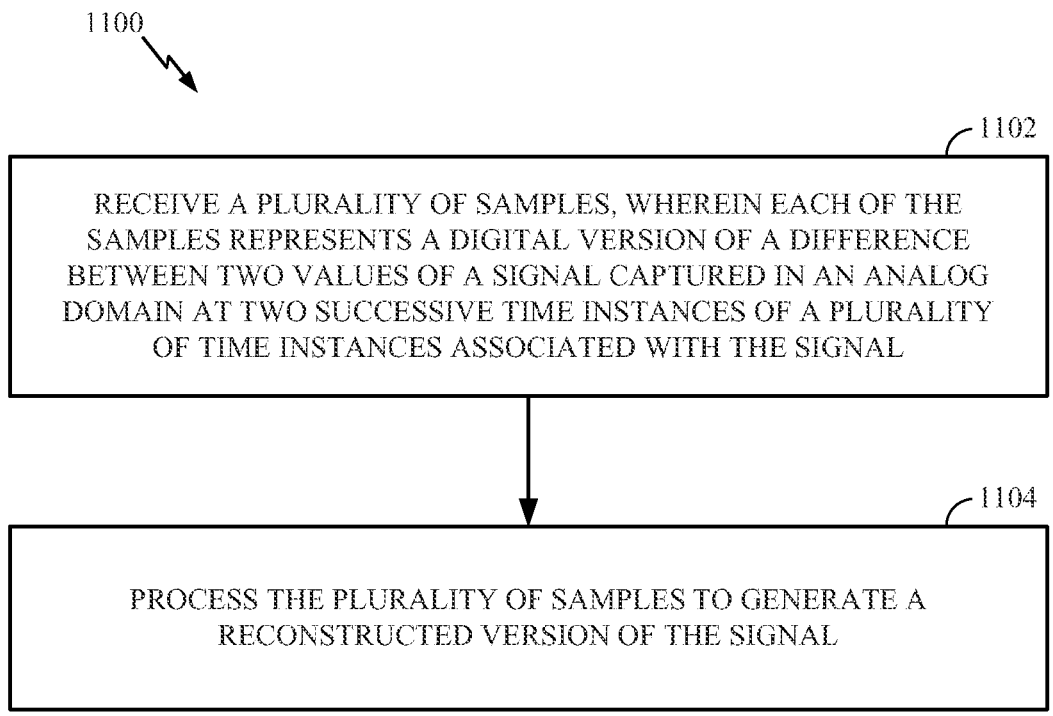
FIG. 11 illustrates example operations that may be performed at a receiver device in accordance with certain aspects of the present disclosure.

FIG. 11 illustrates example operations 1100 that may be performed at a receive device (e.g., at the aggregator 110 from FIG. 1 and/or at the receiver device 800 from FIG. 8) in accordance with certain aspects of the present disclosure. At 1102, the receive device may receive a plurality of samples, wherein each of the samples may represent a digital version of a difference between two values of a signal (e.g., a slowly varying biomedical signal) captured in an analog domain at two successive time instances of a plurality of time instances associated with the signal. At 1104, the receive device may then process (integrate or sum) the received plurality of samples to generate a reconstructed version of the original signal. In an aspect, the reconstructed version of the signal may comprise a plurality of binary values associated with the plurality of time instances. In an aspect, the plurality of samples may be received over a channel (e.g., a wireless channel) from a sensor device comprising a modified SAR ADC, as being illustrated by the system 500 in FIG. 5.

Figure 11A:
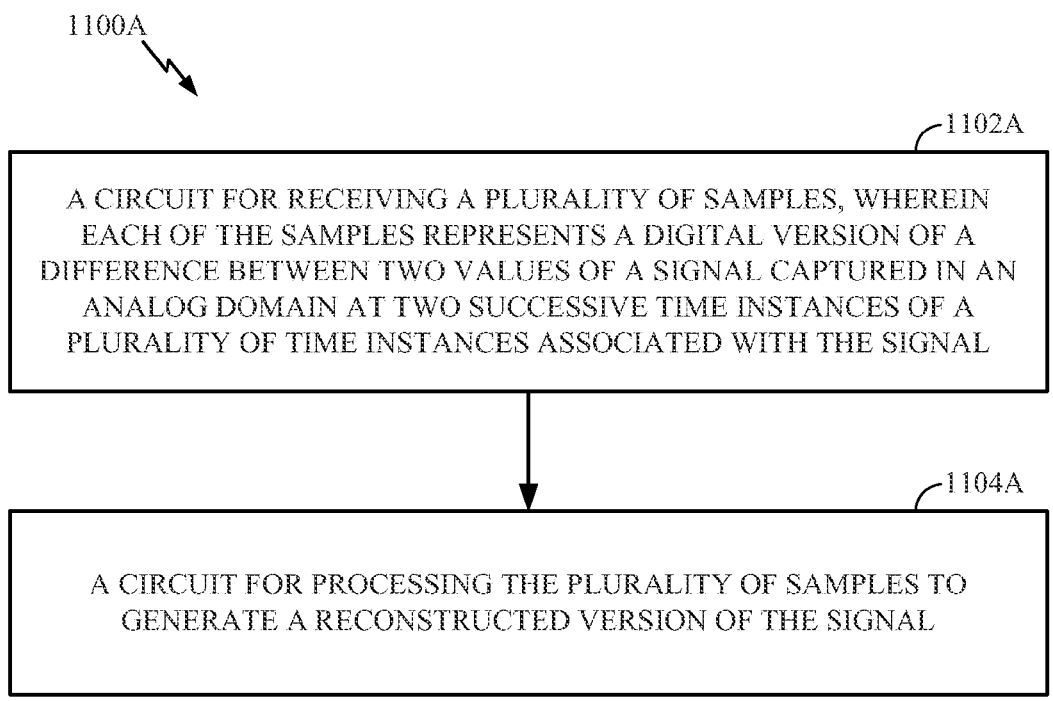
FIG. 11A illustrates example operations that may be performed at a receiver device using example components in accordance with certain aspects of the present disclosure.

FIG. 11A illustrates example operations 1100A that may be performed at a receiver device (e.g., at the aggregator 110 from FIG. 1 and/or at the receiver device 800 from FIG. 8) using example component in accordance with certain aspects of the present disclosure. At 1102A, circuitry of the receiver device (e.g., the antenna 802 and the RCVR unit 806) may be configured to receive a plurality of samples, wherein each of the samples may represent a version of a difference between two values of a signal (e.g., a slowly varying biomedical signal) captured in an analog domain at two successive time instances of a plurality of time instances associated with the signal. At 1104A, circuitry of the receiver device (e.g., the integrator 810) may be configured to process (integrate or sum) the received plurality of samples to generate a reconstructed version of the original signal.

To summarize, the differentiation/integration based SAR ADC for digitizing slowly varying signals is described in the present disclosure, which may realize significant savings of power and area requirements. As aforementioned, the power savings may be achieved partially because fewer bits are modulated and transmitted when the differentiation of the slowly varying signals is performed prior to analog-to-digital conversion. In addition, the reduced dynamic range of the differentiated signal that is being digitized results into a smaller number of capacitors within a SAR ADC (e.g., within the ADC implementation 600 from FIG. 6), which may provide a smaller footprint area of the ADC and reduced power consumption. Smaller power and area requirements may enable smaller batteries resulting into sensor devices that may be less intrusive, more comfortable and more likely to be worn by a user, such as the sensor devices 102, 104, 106 and the acquisition circuit 108 of the BAN 100 from FIG. 1.

This approach may be relevant for digitization of biomedical signals, such as EEG, ECG and ECoG signals. Slowly varying analog signals may be converted to digital signals, wherein the difference between current analog value and previously digitized analog value may be provided to an ADC. The resulting digital data may be transmitted to a gateway, a receiver (e.g., the receiver device 800 from FIG. 8), or the aggregator 110 of the BAN 100 from FIG. 1, which may integrate the received digital data to generate a digital representation of the analog signal.

The various operations of methods described above may be performed by any suitable means capable of performing the corresponding functions. The means may include various hardware and/or software component(s) and/or module(s), including, but not limited to a circuit, an application specific integrate circuit (ASIC), or processor. Generally, where there are operations illustrated in Figures, those operations may have corresponding counterpart means-plus-function components with similar numbering. For example, operations 1000 and 1100 illustrated in FIGS. 10 and 11 correspond to components 1000A and 1100A illustrated in FIGS. 10A and 11A.

For example, the means for capturing may comprise an application specific integrated circuit, e.g., the processor 204 of the wireless device 202 from FIG. 2, the signal detector 218 of the wireless device 202, or the module 600 from FIG. 6. The means for transmitting may comprise a transmitter, e.g., the transmitter 210 of the wireless device 202. The means for producing may comprise an application specific integrated circuit, e.g., the processor 204, the signal detector 218, or the module 600. The means for generating may comprise an application specific integrated circuit, e.g., the processor 204, the signal detector 218, or the module 600. The means for replacing may comprise an application specific integrated circuit, e.g., the processor 204, the signal detector 218, or the module 600. The means for determining may comprise an application specific integrated circuit, e.g., the processor 204, the signal detector 218, or the module 600. The means for processing may comprise an application specific integrated circuit, e.g., the signal detector 218 or the module 810 of the receiver device 800 from FIG. 8. The means for integrating may comprise an application specific integrated circuit, e.g., the signal detector 218 or the module 810. The means for summing may comprise an application specific integrated circuit, e.g., the signal detector 218 or the module 810. The means for receiving may comprise a receiver, e.g., the receiver 212 of the wireless device 202.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Bluray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

A wireless device in the present disclosure may include various components that perform functions based on signals that are transmitted by or received at the wireless device. A wireless device may also refer to a wearable wireless device. In some aspects the wearable wireless device may comprise a wireless headset or a wireless watch. For example, a wireless headset may include a transducer adapted to provide audio output based on data received via a receiver. A wireless watch may include a user interface adapted to provide an indication based on data received via a receiver. A wireless sensing device may include a sensor adapted to provide data to be transmitted via a transmitter.

A wireless device may communicate via one or more wireless communication links that are based on or otherwise support any suitable wireless communication technology. For example, in some aspects a wireless device may associate with a network. In some aspects the network may comprise a personal area network (e.g., supporting a wireless coverage area on the order of 30 meters) or a body area network (e.g., supporting a wireless coverage area on the order of 10 meters) implemented using ultra-wideband technology or some other suitable technology. In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components (e.g., transmitter 210 and receiver 212) that may include various components (e.g., signal generators and signal processors) that facilitate communication over a wireless medium.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA") or so-called smart-phone, an entertainment device (e.g., a portable media device, including music and video players), a headset (e.g., headphones, an earpiece, etc.), a microphone, a medical sensing device (e.g., a biometric sensor, a heart rate monitor, a pedometer, an EKG device, a smart bandage, etc.), a user I/O device (e.g., a watch, a remote control, a light switch, a keyboard, a mouse, etc.), an environment sensing device (e.g., a tire pressure monitor), a monitoring device that may receive data from the medical or environment sensing device (e.g., a desktop, a mobile computer, etc.), a point-of-care device, a hearing aid, a set-top box, or any other suitable device. The monitoring device may also have access to data from different sensing devices via connection with a network.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses).

In some aspects a wireless device may comprise an access device (e.g., an access point) for a communication system. Such an access device may provide, for example, connectivity to another network (e.g., a wide area network such as the Internet or a cellular network) via a wired or wireless communication link. Accordingly, the access device may enable another device (e.g., a wireless station) to access the other network or some other functionality. In addition, it should be appreciated that one or both of the devices may be portable or, in some cases, relatively non-portable. Also, it should be appreciated that a wireless device also may be capable of transmitting and/or receiving information in a non-wireless manner (e.g., via a wired connection) via an appropriate communication interface.

While the foregoing is directed to aspects of the present disclosure, other and further aspects of the disclosure may be devised without departing from the basic scope thereof, and the scope thereof is determined by the claims that follow.

The invention claimed is:

1. A signal processing apparatus, comprising:
   difference circuitry configured to produce a difference value by offsetting a current sampled voltage of an input analog signal with a previous sampled voltage of the input analog signal, wherein the current and previous sampled voltages are held by first and second capacitive elements, respectively, and wherein the offsetting of the current sampled voltage with the previous sampled voltage is produced through a charge exchange between the first and second capacitive elements; and
   conversion circuitry configured to generate a digital representation of the difference value.

2. The apparatus of claim 1, wherein the difference circuitry is also configured to:
   replace the previous sampled voltage held by the second capacitive element with a new sampled voltage of the input analog signal that is substantially equal to the current sampled voltage.

3. The apparatus of claim 2, wherein the difference circuitry is also configured to:
   produce another difference value by offsetting the new sampled voltage held by the second capacitive element with a new current sampled voltage of the input analog signal held by the first capacitive element through a charge exchange between the first and second capacitive elements.

4. The apparatus of claim 3, wherein the conversion circuitry is also configured to:
   generate a digital representation of the another difference value, and the apparatus further comprising
   a transmitter configured to transmit the digital representation of the difference value and the digital representation of the another difference value.

5. The apparatus of claim 1, wherein:
   the digital representation comprises a plurality of bits;
   the conversion circuitry is configured to determine each of the bits of the digital representation during a different conversion cycle; and
   the conversion circuitry is also configured to determine the bits of the digital representation in order from a Most Significant Bit (MSB) of the digital representation to a Least Significant Bit (LSB) of the digital representation.

6. The apparatus of claim 1, wherein:
   the digital representation comprises a plurality of bits;
   the conversion circuitry is configured to successively offset the difference value by different reference voltages of the conversion circuitry; and
   the conversion circuitry is also configured to determine a different bit of the digital representation as a result of each offsetted difference value.

7. The apparatus of claim 1, further comprising:
   a successive approximation register analog-to-digital converter (SAR ADC) comprising the difference circuitry and the conversion circuitry, and wherein
   a dynamic range of an input of the SAR ADC is smaller than a dynamic range of the input analog signal.

8. The apparatus of claim 1, wherein:
   the input analog signal comprises more energy in a first frequency band than in a second frequency band, and
   any frequency of the first frequency band is smaller than any frequency of the second frequency band.

9. The apparatus of claim 1, wherein the input analog signal comprises a biomedical signal.

10. The apparatus of claim 9, wherein the biomedical signal comprises at least one of an electrocardiogram (ECG) signal, an electroencephalogram (EEG) signal, or an electrocorticogram (ECoG) signal.

11. The apparatus of claim 1, wherein:
    the conversion circuitry comprises a comparator.

12. A method for signal processing, comprising:
    producing a difference value by offsetting a current sampled voltage of an input analog signal with a previous sampled voltage of the input analog signal, wherein the current and previous sampled voltages are held by first and second capacitive elements, respectively, and wherein the offsetting of the current sampled voltage with the previous sampled voltage is produced through a charge exchange between the first and second capacitive elements; and
    generating a digital representation of the difference value.

13. The method of claim 12, wherein producing the difference value comprises:
    replacing the previous sampled voltage held by the second capacitive element with a new sampled voltage of the input analog signal that is substantially equal to the current sampled voltage.

14. The method of claim 13, wherein producing the difference value further comprises:
    producing another difference value by offsetting the new sampled voltage held by the second capacitive element with a new current sampled voltage of the input analog signal held by the first capacitive element through a charge exchange between the first and second capacitive elements.

15. The method of claim 14, further comprising:
generating a digital representation of the another difference value; and
transmitting the digital representation of the difference value and the digital representation of the another difference value.

16. The method of claim 12, wherein
the digital representation comprises a plurality of bits, and generating the digital representation comprises:
determining each of the bits of the digital representation during a different conversion cycle; and
determining the bits of the digital representation in order from a Most Significant Bit (MSB) of the digital representation to a Least Significant Bit (LSB) of the digital representation.

17. A signal processing apparatus, comprising:
means for producing a difference value by offsetting a current sampled voltage of an input analog signal with a previous sampled voltage of the input analog signal, wherein the current and previous sampled voltages are held by first and second capacitive elements, respectively, and wherein the offsetting of the current sampled voltage with the previous sampled voltage is produced through a charge exchange between the first and second capacitive elements; and
means for generating a digital representation of the difference value.

18. The apparatus of claim 17, further comprising:
means for replacing the previous sampled voltage held by the second capacitive element with a new sampled voltage of the input analog signal that is substantially equal to the current sampled voltage.

19. The apparatus of claim 18, further comprising:
means for producing another difference value by offsetting the new sampled voltage held by the second capacitive element with a new current sampled voltage held by the first capacitive element through a charge exchange between the first and second capacitive elements.

20. The apparatus of claim 19, further comprising:
means for generating a digital representation of the another difference value; and
means for transmitting the digital representation of the difference value and the digital representation of the another difference value.

21. The apparatus of claim 17, wherein
the digital representation comprises a plurality of bits, and the apparatus further comprising:
means for determining each of the bits of the digital representation during a different conversion cycle; and
means for determining the bits of the digital representation in order from a Most Significant Bit (MSB) of the digital representation to a Least Significant Bit (LSB) of the digital representation.

22. A signal processing apparatus, comprising:
difference circuitry configured to produce a difference value by offsetting a current value of an analog signal with a stored previous value of the analog signal;
conversion circuitry configured to generate a digital representation of the difference value;
a successive approximation register analog-to-digital converter (SAR ADC) comprising the difference circuitry and the conversion circuitry, and wherein
a dynamic range of an input of the SAR ADC is smaller than a dynamic range of the analog signal.

23. A method for signal processing, comprising:
producing a difference value by offsetting a current value of an analog signal with a stored previous value of the analog signal, wherein producing the difference value is performed by a successive approximation register analog-to-digital converter (SAR ADC), and wherein a dynamic range of an input of the SAR ADC is smaller than a dynamic range of the analog signal; and
generating a digital representation of the difference value.

* * * * *